United States Patent [19]

Goo

[11] Patent Number: 5,821,145
[45] Date of Patent: Oct. 13, 1998

[54] METHOD FOR ISOLATING ELEMENTS IN A SEMICONDUCTOR DEVICE

[75] Inventor: Jung-Suk Goo, Seoul, Rep. of Korea

[73] Assignee: LG Semicon Co., Ltd., Chungcheongbuk-do, Rep. of Korea

[21] Appl. No.: 795,532

[22] Filed: Feb. 5, 1997

Related U.S. Application Data

[63] Continuation of Ser. No. 508,880, Jul. 28, 1995, abandoned.

[30] Foreign Application Priority Data

Jul. 28, 1994 [KR] Rep. of Korea ................... 1994 18410

[51] Int. Cl.$^6$ .................................................. H01L 21/336
[52] U.S. Cl. .......................... 438/294; 438/299; 438/298; 438/300; 438/450; 438/526
[58] Field of Search ................................. 437/69, 70, 26, 437/28; 438/298, 299, 300, 499, 450, 526, 294

[56] References Cited

U.S. PATENT DOCUMENTS

| | | | |
|---|---|---|---|
| 4,968,640 | 11/1990 | Chao | 437/61 |
| 5,118,641 | 6/1992 | Roberts | 437/69 |
| 5,137,843 | 8/1992 | Kim | 437/70 |
| 5,236,862 | 8/1993 | Pfiester | 437/70 |
| 5,342,803 | 8/1994 | Shimoji | 437/70 |
| 5,365,082 | 11/1994 | Gill et al. | 437/69 |
| 5,478,759 | 12/1995 | Mametani et al. | 437/70 |

FOREIGN PATENT DOCUMENTS

| | | | |
|---|---|---|---|
| 0000937 | 1/1984 | Japan | 437/70 |
| 2183905 | 6/1987 | United Kingdom | 437/69 |

OTHER PUBLICATIONS

IEEE Transactions on Electron Devices, vol. ED–33, No. 11, Nov. 1986, pp. 1659–1666, "Scealed CMOS Technology Using SEG Isolation and Buried Well Process," by Endo, et al.

*Primary Examiner*—Trung Dang
*Attorney, Agent, or Firm*—Loudermilk & Associates

[57] ABSTRACT

A method for isolating elements in semiconductor devices is disclosed, which includes the steps of: forming a field oxide layer on the surface of a semiconductor substrate; using a photo resist pattern to define a field region and an active region; carrying out an ion implantation of several MeV with the photo resist pattern remaining on the field region, so as to form a channel stop layer on the field oxide layer region; and forming a soft error-preventing buried layer in the active region. The field insulating layer may be a silicon oxide layer or a silicon nitride layer. Additionally, a selective epitaxial process may be carried out so as to raise the level of the active region to substantially the height of the field isolating region, thereby flattening the surface.

10 Claims, 3 Drawing Sheets

METHOD FOR ISOLATING ELEMENTS IN A SEMICONDUCTOR DEVICE

This application is a continuation of application Ser. No. 08/508,880 filed on Jul. 28, 1995 now abandoned.

FIELD OF THE INVENTION

The present invention relates to isolation methods for semiconductor devices, and more particularly to a method for electrically isolating unit elements of a semiconductor device.

BACKGROUND OF THE INVENTION

Generally, efforts have been made to minimize the isolating regions (field regions) for isolating unit elements of MOS (metal oxide semiconductor) integrated circuits, and such minimized isolation techniques have been a key to improving the density of semiconductor devices. The most widely utilized of the element isolating methods is the LOCOS (local oxidation of silicon) method, which is a local oxidizing method.

As disclosed in U.S. Pat. No. 3,755,014, the LOCOS method is constituted such that a nitride pattern is formed on a silicon substrate, and the silicon substrate is oxidized, thereby forming an isolating region. With such a method, in order to reduce the stress caused by the nitride layer, U.S. Pat. No. 4,564,394 proposes to use a pad oxide layer as an under-layer of the nitride layer. In this method, a pad oxide layer and a nitride layer are deposited on a semiconductor substrate, and a photo resist pattern is formed to define an active region and a field region, and an oxidation process is carried out so as to form a LOCOS oxide layer.

With this method, however, for a sub-micron scale process, two limitations can occur. With the general LOCOS process, an oxide layer "bird's beak" appears sideward during the formation of the field oxide layer. Another problem is that the dopant is diffused from under the LOCOS oxide layer outwardly, with the result that the area of the active region is reduced, and the threshold voltage of the semiconductor device raises due to the narrow width effect. In order to solve such problems, a variety of methods have been suggested.

First, efforts for reducing the field oxide bird's beak are as follows. There is an element isolating method known as ROI (recessed oxide isolation). With this method, an oxide layer and a nitride layer are successively deposited on a semiconductor substrate, and the portions of the nitride layer and the oxide layer on which the isolating region is to be formed are removed, thereby exposing the portions of the semiconductor substrate on which the field region is to be formed. An etching is carried out in such a manner that a step difference is formed on the isolating region. Then, a channel stop ion implantation is carried out, and a LOCOS oxide layer is formed by carrying out a LOCOS process.

With this ROI method, however, the step difference is formed on the semiconductor substrate before the formation of the LOCOS oxide layer, and, therefore, defects can occur due to the silicon etching and the stress induced during the oxidation process.

Further, there is a limit to inhibiting the formation of the bird's beak.

Another method is the PLB (polysilicon layer buffered) method. With this method, a polysilicon side wall is formed between the active region and the isolating region, so that the side wall may first be oxidized. Consequently, the oxidation of the silicon of the active region is delayed so as to inhibit the formation of the bird's beak.

This method provides a stress absorbing effect due to the polysilicon side wall, but the bird's beak could not be reduced to a great degree. Patents relating to this method includes U.S. Pat. Nos. 3,961,999, 4,376,336, 4,407,696, 4,435,446, 4,459,325, 4,508,757, and 4,968,640.

There is another method called the SILO (sealed interface local oxidation) method. With this method, a nitride layer is formed through ion implantation or deposition for preventing the intrusion of oxygen, and an oxide layer and a nitride layer are formed before carrying out the subsequent steps. This method is for reducing stress and the bird's beak. A reference for this method is IEEE Transactions on Electron Devices Vol. ED-29, No. 4, P554, April 1982.

With this method, however, new problems can occur such that, if the bird's beak is to be sufficiently reduced, the nitride layer has to be thick, and, if the nitride layer is made to be thick, then stress is produced. Patents relating to this method are U.S. Pat. Nos. 4,564,394, 4,764,248, and 5,236,862.

There is still another method called the SWAMI (side wall masked isolation) method. With this method, the formation of the bird's beak is inhibited by utilizing the space of a nitride layer side wall. With this method, however, defects occur due to the stress which is built up during the silicon etching and oxidation process. Patents relating to this method are U.S. Pat. Nos. 4,272,308, 4,583,281, and 5,118,641.

As still another conventional method, there is a method utilizing a selective epitaxial process. A reference relating to this method is IEEE Trans. Electron Devices, ED-31, P1741, 1984, and ED-33, P1659, 1986. This method shows some promise and is one of the most recent solutions proposed for the bird's beak. With this method, however, a channel stop ion implantation cannot be self-aligned, and, therefore, the isolating characteristics in a high density device are aggravated. Further, if the isolating characteristics are to be improved, a $P^+$ substrate has to be used. In this case, the epitaxial layer has to be grown thick for adjusting the step difference, and there is a difficulty in growing the epitaxial layer thick.

The efforts for solving the problem of the diffusion of the channel stop ions (i.e., the second problem of the LOCOS method) have been made in the manner described below.

Based on the methods of U.S. Pat. Nos. 5,137,843 and 5,196,367, a side wall is utilized for adjusting the ion implantation point. That is, a side wall space is formed on a side of a nitride layer which is used for a mask for the LOCOS oxidation process, and a field ion implantation is carried out. With this method, however, there is the disadvantage that an additional process for forming the side wall is required. Further, it is not effective in reducing the formation of the bird's beak.

FIGS. 1A and 1B illustrate a conventional element isolating method. With this method, in order to improve the narrow width effect, field ions are implanted after formation of a LOCOS oxide layer so as to form a channel stop layer. At the same time, a high concentration doped region is formed under the active region. This method will be described in further detail referring to the drawings.

FIG. 1A is a sectional view illustrating the state after carrying out the process. First, LOCOS oxide layer 13 is formed by applying a usual LOCOS process on semiconductor substrate 11 in which no field ion implantation has been carried out. Channel stop layer 12-1 and high concentration doped region 12-2 are formed by carrying out an ion implantation into the field region and the active region.

With this method, however, a pad oxide layer and a nitride layer are deposited on semiconductor substrate 11, and photo resist is used to define the active region and the field region. The photo resist is removed, and a LOCOS oxide layer is formed by carrying out a LOCOS oxidation process. Impurity ions are implanted into the whole surface of the semiconductor substrate. In carrying out the ion implantation, an energy of several hundreds of KeV has to be used, so that the ions are able to penetrate into the oxide layer. The ions which are implanted into the field region pass through LOCOS oxide layer 13 to channel stop layer 12-1 and to a certain depth into semiconductor substrate 11. The ions which are implanted into the active region penetrate into the silicon layer of the semiconductor substrate, so that doped region 12-2 may be formed on a portion deeper than the channel stop layer so as to prevent soft errors.

In this process, two facts have to be taken into account for the ion projecting distances. First, in order to improve the isolating characteristics of the device, the ion projecting distance may be adjusted in such a manner that the dopant concentration in the channel stop layer may be highest just below the interface between the LOCOS oxide layer and the silicon layer. Second, the ions which are implanted into the active region for forming the doped region have to be adjusted as to projecting distance, so that the ions may have a sufficient depth so as not to affect the characteristics of the active region.

In this conventional technique, however, the ion implantation is carried out with an energy of several hundreds of KeV, and, therefore, the depth of the doped region is not sufficient, with the result that the active region is adversely affected. Consequently, it is impossible to form a sufficiently high concentration channel stop layer. Further, the highest impurity concentration of the channel stop layer is located below the interface between the oxide layer and the substrate, and, therefore, the element isolating characteristics are aggravated.

FIG. 1B illustrates the doping concentration versus the depth of the substrate below the channel stop layer. Dotted curve B-1 represents the ion distribution within the channel stop layer which is formed in the general LOCOS method. Solid line curve B-2 represents the ion distribution within the channel stop layer, which is formed with a high ion implanting energy.

As described above, the ion concentration distribution within the channel stop layer has the highest concentration point significantly below the interface between the LOCOS oxide layer and the silicon layer. That is, with this method, the narrow width effect is improved due to the prevention of the sideward diffusion of the ions, but the concentration on the interface between the LOCOS oxide layer and the substrate is lowered, with the result that the element isolating characteristics are aggravated.

Thus, while efforts have been made to improve the LOCOS method for isolating unit elements, a method in which the bird's beak and the impurity sideward diffusion problems are solved has not been realized yet with the above-described methods.

SUMMARY OF THE INVENTION

The present invention is intended to overcome the above-described disadvantages of the conventional techniques.

It is an object of the present invention to provide a method for isolating elements in a semiconductor device, in which a field oxide layer, which has a great importance in the MOS process, is formed in a simple manner, and the sideward diffusion of the channel stop ions and the formation of the bird's beak are inhibited, thereby improving the element isolating characteristics of a semiconductor device.

In achieving the above and other objects, the process for isolating elements of a semiconductor device according to the present invention includes the steps of: (a) forming an insulating layer on a semiconductor substrate to be used as a field isolating layer; (b) forming a photoresist pattern through a photo process to define a field region and an active region; (c) forming a field insulating layer by etching the insulating layer on the active region using the photoresist pattern as an etch mask layer; and (d) carrying out a channel stop ion implantation under the existence of the photo resist pattern, so as to form a channel stop layer under the field isolating layer and a high concentration doped region in a deep portion in the active region. The field insulating layer may be a silicon oxide layer or a silicon nitride layer. After step (d), a selective epitaxial process may be carried out so as to raise the level of the active region to the height of the field isolating region, thereby flattening the surface.

BRIEF DESCRIPTION OF THE DRAWINGS

The above objects and other advantages of the present invention will become more apparent by describing in detail the preferred embodiments of the present invention with reference to the attached drawings in which.

DESCRIPTION OF THE PREFERRED EMBODIMENTS

FIGS. 2A–2D illustrate a method for isolating elements of a semiconductor device according to the present invention.

Figure 2A:
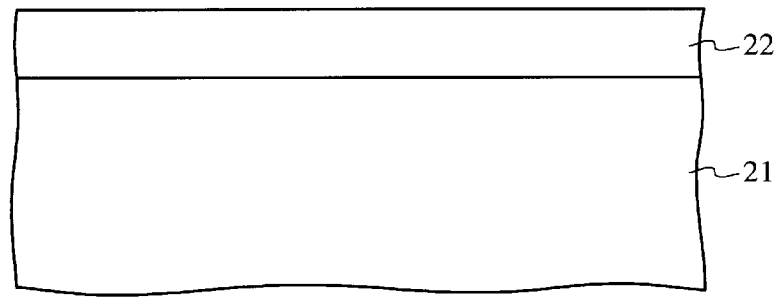
FIGS. 2A–D, 3 and 4 illustrate an element isolating method for a semiconductor device according to the present invention.

As illustrated in FIG. 2A, insulating layer 22 is formed on semiconductor substrate 21 to a relatively thick thickness after completing a well forming step in the usual manner. With the present invention, in forming the field isolating layer, the LOCOS method, which causes the bird's beak and the sideward diffusion of the impurity ions, is not used. Insulating layer 22 is used in the present invention.

Insulating layer 22 is formed by a thermal oxidation or by a CVD method, and a field region is defined without using the thermal step of the LOCOS process, so that the defined field region can be used as the field isolating layer. Therefore, insulating layer 22 may consist of a nitride layer instead of an oxide layer.

Figure 2B:
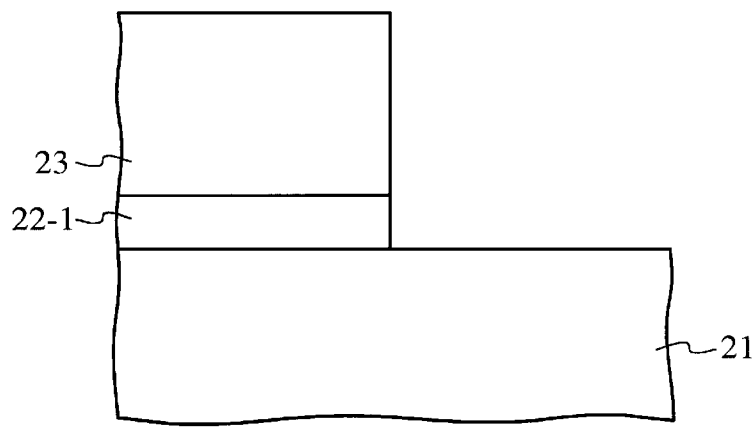

As illustrated in FIG. 2B, photo resist is coated on the insulating layer. Through exposure and development, a patterning is made in such a manner that the photo resist remains only on the field region, thereby forming photo resist pattern 23. Using photo resist pattern 23 as a mask, the insulating layer of the active region is removed, thereby forming field isolating layer 22-1.

Figure 2C:
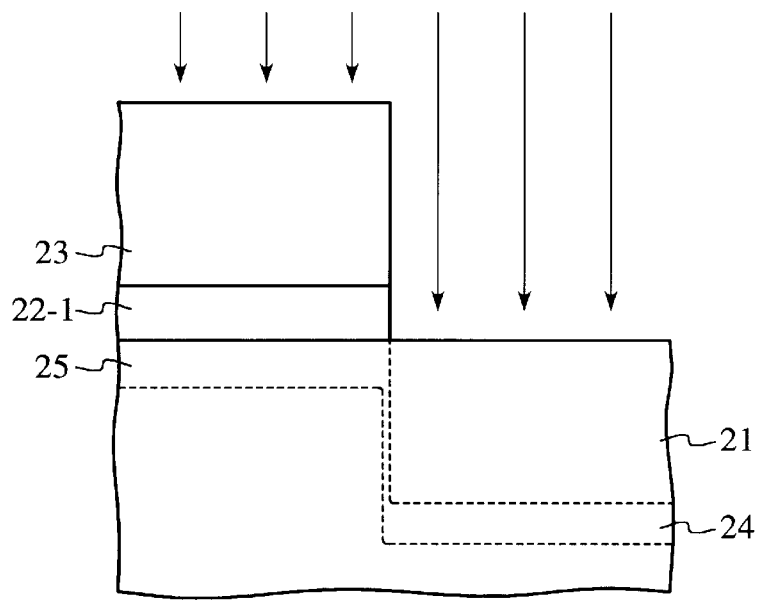

As illustrated in FIG. 2C, with photo resist pattern 23 remaining, channel stop ions are implanted into the surface of semiconductor substrate 21. The ions thus implanted are injected with a sufficient energy, so that they may pass through photo resist pattern 23 and field isolating layer 22-1 to enter into semiconductor substrate 21. Therefore, the implanting energy may be several MeV. Thus, the projecting distance of ion implantation is adjusted to the interface between field oxide layer 22-1 and semiconductor substrate 21.

After the ion implantation, channel stop layer 25 and high concentration doped region 24, with a depth of several μm, are formed simultaneously in substrate 21. The ions implanted into the field region are injected with an energy of several MeV, so that they may form a channel stop layer having the highest concentration at the interface between the field isolating region and the substrate. On the other hand, the ions implanted into the active region are injected deeply in such a manner that they may not adversely influence the elements of the active region, thereby forming a doped region.

The channel stop layer has a feature such that, the higher the doping concentration, the better the isolating characteristics between the elements become. Conventionally, however, if the concentration of the channel stop layer is increased, the concentration of the doped region lying under the active region also is increased, and consequently there is a limit to increasing the concentration of the channel stop layer. With the present invention, the depth of the doped region formed under the active region has a depth sufficient not to significantly influence the active elements. Therefore, the impurity concentration of the channel stop layer can be increased, and consequently the thickness of the field isolating layer can be reduced. Given the reduction of the thickness of the field isolating layer, the step difference on the surface of the substrate is reduced, with the result that the step coverage is improved.

Figure 2D:
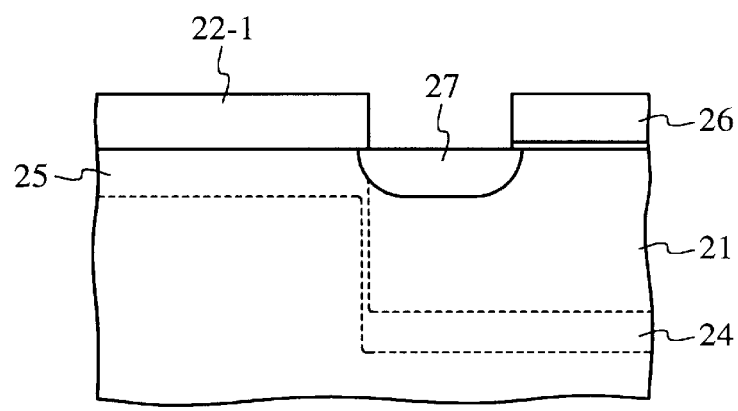

As illustrated in FIG. 2D, in a conventional manner, photo resist pattern 23 is removed, and elements such as gate 26 and source/drain junction 27 (and other elements of an MOSFET) are formed in the active region.

Figure 3:
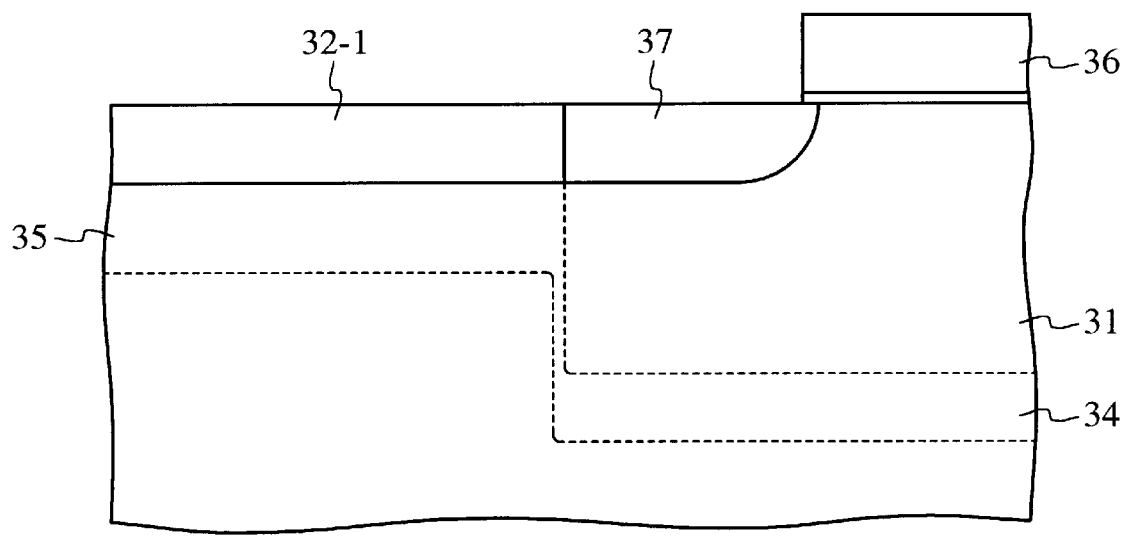

FIG. 3 illustrates another embodiment of the present invention in which the flatness of wafer surface is improved.

Field isolating layer 32-1 is formed in the same method as that of the first embodiment, and an ion implantation is carried out in the same manner as that of the first embodiment for forming channel stop layer 35 and high concentration doped region 34. Then, a selective epitaxial process is carried out so as to grow an epitaxial layer on semiconductor substrate 31, thereby raising the height of the substrate to substantially the same height as that of field isolating layer 32-1. The subsequent elements of an MOSFET, such as a gate oxide, gate electrode 36 on the gate oxide, and source/drain regions 37, are formed in the conventional manner.

Figure 1A:
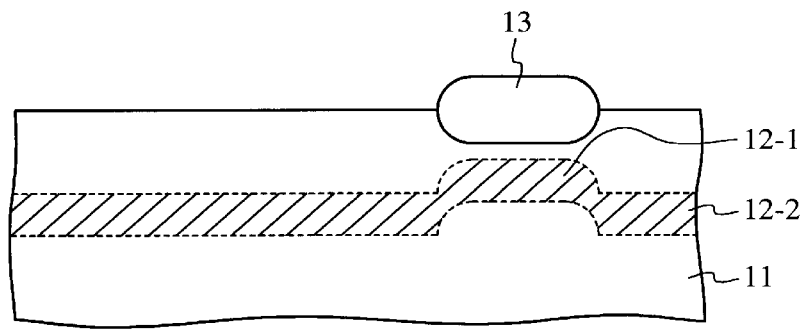
FIGS. 1A and 1B illustrate an element isolating method of a conventional semiconductor device.
Figure 1B:
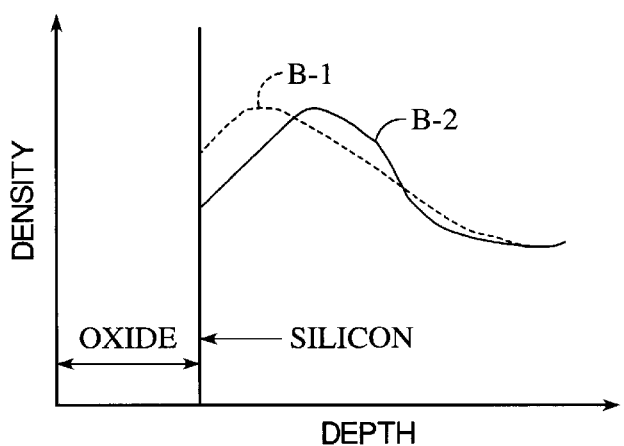
Figure 4:
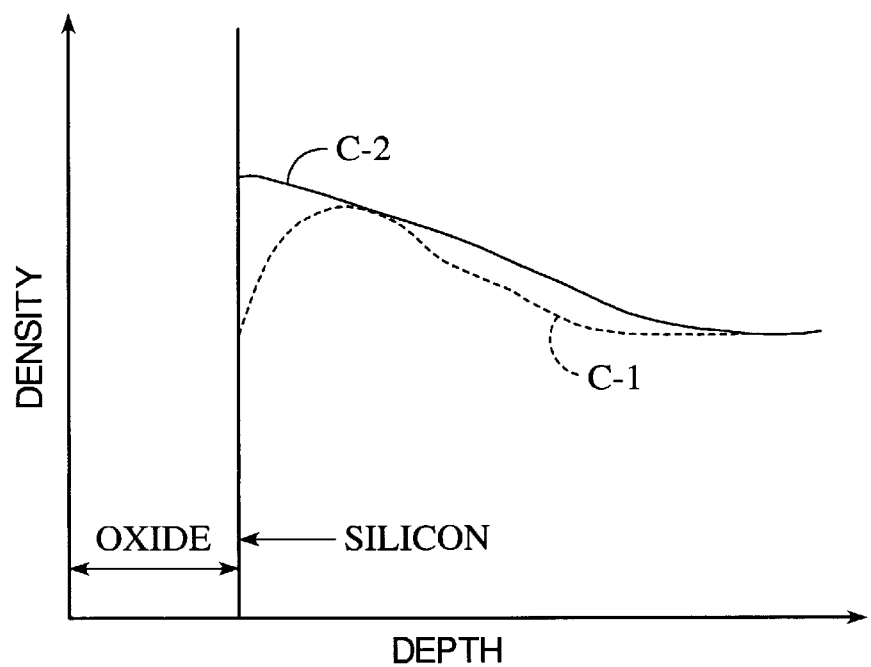

FIG. 4 illustrates a comparison of the doping concentration of the field isolating layer of the present invention with that of the conventional field isolating layer of FIG. 1.

In FIG. 4, dotted curve C-1 represents the ion distribution of the conventional channel stop layer, while solid line curve C-2 represents the ion distribution of the channel stop layer of the present invention. As illustrated in FIG. 4, the ion distribution of the conventional channel stop layer has the highest concentration at a portion slightly deeper than the interface between the isolating layer and the substrate. Therefore, the isolating characteristics between the elements are aggravated.

The ion distribution of the channel stop layer of the present invention, however, has the highest concentration at the interface between the isolating layer and the substrate. Therefore, the isolating characteristics between the elements are significantly improved. At the same time, a conductive buried layer is formed under the active region, so that soft errors in the device can be prevented.

The present invention may provide the following effects.

The nitride layer of the LOCOS process is not used, and therefore, defects which are caused by the stress which is in turn caused by the thermal process do not occur. Further, a bird's beak is not formed during formation of the field isolating layer. There is no thermal process after implantation of the dopant for the channel stop layer, and, therefore, the outward diffusion of the channel stop dopant is prevented, with the result that the narrow width effect is markedly reduced.

The concentration of the channel stop dopant can be sufficiently raised due to the prevention of the outward diffusion of the dopant, and, therefore, the isolating characteristics are improved. As the dopant concentration can be raised, the thickness of the field isolating layer can be made thinner, with the result that the flatness is improved. Further, a conductive buried layer is formed under the active region on the semiconductor substrate, and, therefore, soft errors may be prevented in the device.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A method for isolating elements in a semiconductor device, comprising the steps of:
   (a) forming an insulating layer on a semiconductor substrate;
   (b) forming a photoresist pattern on the insulating layer to define a field region and an active region;
   (c) removing the insulating layer on the active region using the photoresist pattern as an etch mask layer to form a field isolating layer on the field region;
   (d) implanting channel stop ions into the substrate, wherein a channel stop layer is formed under the field isolating layer by implanting ions through the photoresist pattern and a high concentration doped region is formed in the active region; and
   (e) conducting a selective epitaxial growth process, wherein the level of the active region is raised to substantially the height of the field isolating region, wherein the overall surface is flattened.

2. The method of claim 1, wherein the insulating layer of step (a) comprises a silicon oxide layer.

3. The method of claim 2, wherein the step of forming the silicon oxide layer comprises a thermal oxidation process.

4. The method of claim 2, wherein the step of forming the silicon oxide layer comprises a CVD method.

5. The method of claim 1, wherein the insulating layer of step (a) comprises a silicon nitride layer.

6. The method of claim 1, wherein the projecting distance of the ions during the implanting step is adjusted so that the ions are substantially positioned at the interface between the field isolating layer and the semiconductor substrate.

7. The method of claim 6, wherein the ion implantation is carried out with an energy sufficient for the ions to pass through the field insulating layer.

8. The method of claim 7, wherein the implanting step comprises implanting ions with an energy of several MeV.

9. The method of claim 1, wherein the doped region under the active region is formed at a depth of several μm into the semiconductor substrate, wherein the doped region does not adversely influence elements formed in the active region.

10. The method of claim 9, wherein doped region inhibits soft errors in the elements formed in the active region.

* * * * *